United States Patent [19]
Alonas et al.

[11] Patent Number: 5,128,729
[45] Date of Patent: Jul. 7, 1992

[54] COMPLEX OPTO-ISOLATOR WITH IMPROVED STAND-OFF VOLTAGE STABILITY

[75] Inventors: Paul G. Alonas, Scottsdale; Joseph H. Slaughter, III, Mesa; Niraj Kohli, Scottsdale, all of Ariz.

[73] Assignee: Motorola, Inc., Schaumburg, Ill.

[21] Appl. No.: 611,625

[22] Filed: Nov. 13, 1990

[51] Int. Cl.[5] .................... H01L 31/12; H01L 45/00; H01L 23/48
[52] U.S. Cl. ........................................ 357/19; 357/2; 357/68
[58] Field of Search ................................ 357/19, 2, 68

[56]         References Cited
         U.S. PATENT DOCUMENTS
4,495,512  1/1985  Isaac et al. ............................ 357/67

Primary Examiner—Mark Prenty
Attorney, Agent, or Firm—Joe E. Barbee; Robert M. Handy

[57] ABSTRACT

Improved resistance to electrical instability of opto-isolators subjected to large stand-off voltages is obtained by coating the semiconductor light sensing element with a high resistivity layer of amorphous silicon while leaving most of the surface PN junction perimeter and nearby regions free of metal. The amorphous silicon prevents mobile ions in the encapsulation, which are driven to the detector surface by the stand-off voltage, from inverting or modulating the conductivity of the detector surface and causing instability. The amorphous silicon also makes it possible to leave most of the light sensitive PN junctions and nearby regions free of metal, thereby simplifying design of complex IC detector chips and increasing sensitivity.

9 Claims, 12 Drawing Sheets

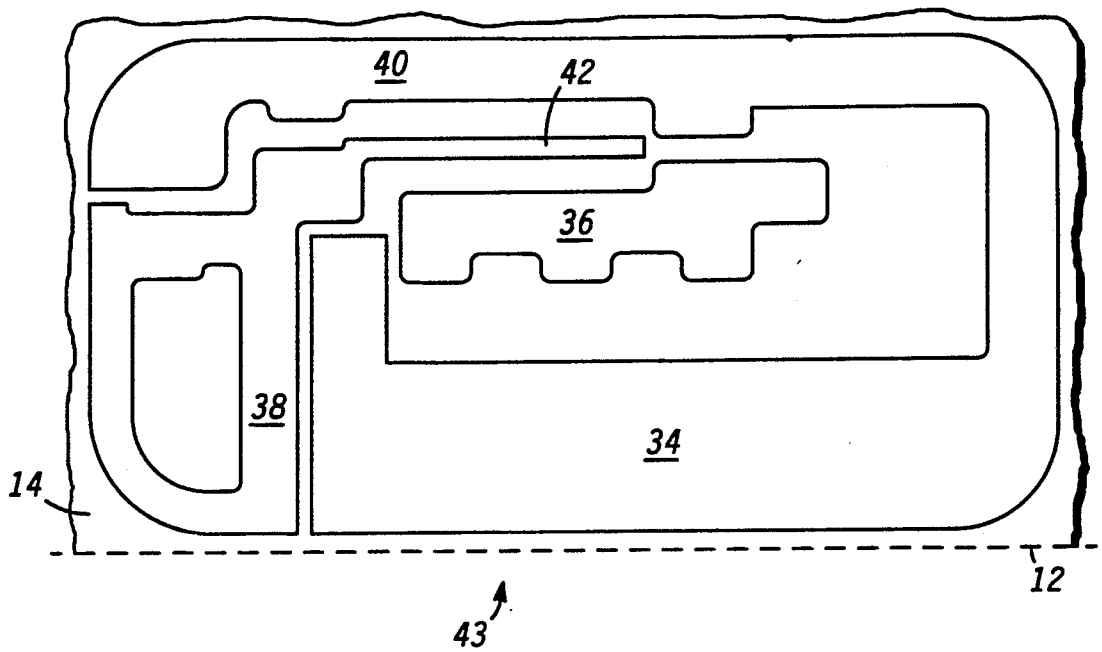
FIG. 6
-PRIOR ART-
FIG. 7
-PRIOR ART-
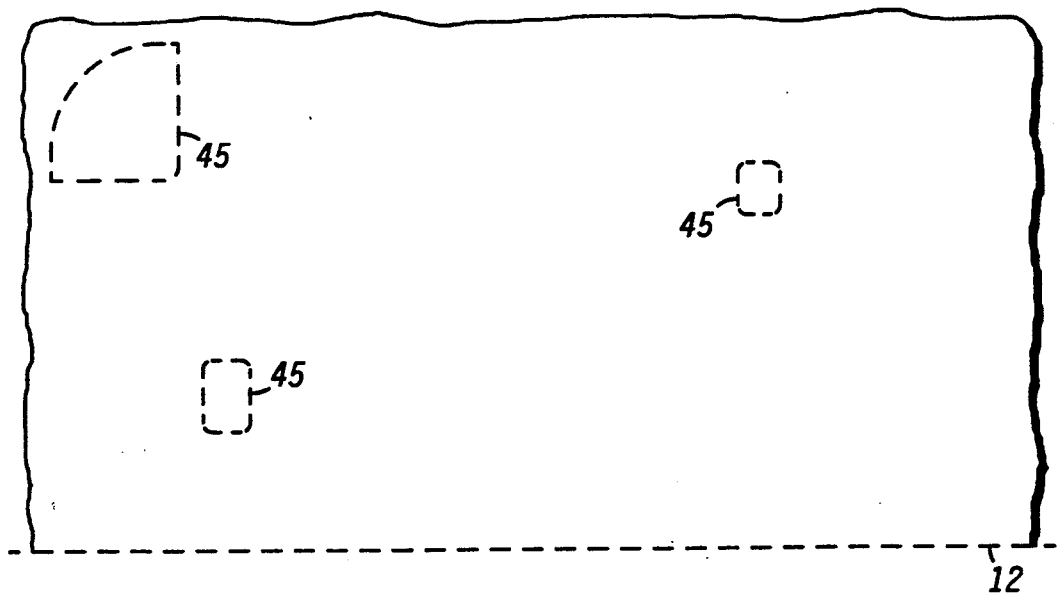

COMPLEX OPTO-ISOLATOR WITH IMPROVED STAND-OFF VOLTAGE STABILITY

FIELD OF THE INVENTION

This invention relates to opto-isolators and, more particularly, semiconductor opto-isolators intended to stand off large voltages between the electrically isolated input and output.

BACKGROUND OF THE INVENTION

The words "die" and "chip", and the words "detector" and "sensor", are used interchangeably herein.

Opto-isolators are well known in the electronics art. Referring to FIG. 1, typical semiconductor opto-isolator 1 comprises light emitting chip 2 mounted on electrical input leads 3 and, spaced apart and electrically isolated therefrom, light sensing or detecting chip 4 mounted on output leads 5. The space between the chips is typically filled with an optically transparent organic dielectric 6, e.g., a die coat, which serves as a "light pipe" to direct light 7 from light emitting chip 2 toward light detecting chip 4.

Die coat 6 is surrounded by opaque outer covering 8, typically a molded plastic encapsulation containing various fillers. No electrical connection exists between input chip 2 and output chip 4. Such opto-isolators provide a very high degree of electrical isolation between input leads 3 and output leads 5. Light emitting diodes (LED's) are examples of typical light emitter chips. Detector chips typically comprise one or more semiconductor elements, as for example, diodes, resistors, transistors, thyristors, TRIACS and/or combinations thereof adapted for optical input. U.S. Pat. Nos. 4,458,408 and 4,396,932 describe a typical prior art light activated detector device suitable for use in an opto-isolator and are incorporated herein by reference.

A particular problem arises when opto-isolator 1 is intended to stand off voltage 9, as for example a voltage $\geq 100$ volts and especially a voltage $\geq 1000$ volts. In this situation, while input optical emitter 2 and output optical detector 4 may each be operating at comparatively low voltages, e.g., 3–15 volts, there is a substantially larger stand-off voltage 9 between input leads 3 and output leads 5, and therefore between emitter die 2 and detector die 4.

Stand-off voltage 9 produces an electric field between input emitter die 2 and output sensor die 4 within opto-isolator 1. Mobile ions 10 may exist within die coat 6 or may enter die coat 6 from the surrounding encapsulation 8 despite the best efforts to avoid them. If the electric field in die coat 6 is large enough and/or the temperature high enough, mobile ions 10 will move and may pile up against the surface of emitter 2 and/or detector 4 or both. In general the mobility of such ions increases with increasing temperature.

To a first approximation, the input-output stand-off voltage creates an electric field at the die surfaces which is approximately perpendicular thereto. This is to be distinguished from the electric field which result from voltage applied to the devices themselves. For example, sometimes detector chip 4 must also support a large blocking voltage within or across the chip. This is typically the case where detector chip 4 is a high voltage thyristor or TRIAC. To a first approximation, the internal blocking voltage within the detector creates at the detector surface an electric field which is approximately parallel to the die surface. Thus, the input-output stand-off voltage and the voltages applied separately to the individual emitter or detector die create approximately orthogonal electric fields and have different effects.

Most light emitting chips are comparatively insensitive to surface ions or other surface charge and the amount of light emitted for a given electrical input is not substantially affected by an accumulation of charge or foreign ions on the emitter surface.

With optical detectors the situation is different. Many types of desirable optical detectors, as for example, photo-diodes, resistors, transistors, thyristors, TRIACS and the like, can be much affected by surface charge. Their electrical properties, e.g., impedance, transconductance, on-off state and the like, can change dramatically depending upon whether or not charged particles are present on certain regions of their surfaces. If ions of a particular polarity pile up on the surface of such detector chips in response to the approximately perpendicular, stand-off electric field, the transfer characteristic of the opto-isolator device as a whole, e.g., the electrical output impedance of the optical detector versus the electrical input signal to the optical emitter, may be unstable, i.e., change with time of operation.

The above-described instability is a significant problem in opto-isolators exposed to stand-off voltages of about $10^3$ volts or more, particularly if they must operate at elevated temperatures. It has been found that instability due to mobile ions in the die coat is very pronounced in opto-isolators in which the detector is made positive with respect to the emitter, that is, when the direction of the approximately perpendicular, stand-off electric field at the surface is such as to attract negative ions to the detector. This die coat mobile ion instability is significant even with detectors which are surface passivated with stable dielectrics, such as silicon oxide, silicon nitride and combinations thereof.

Various techniques have been used in the prior art to overcome this stand-off voltage instability problem. For example, the metallization used to contact the various regions of the detector is extended out onto the surface passivation layer over the locations where the perimeter of the detector PN junctions intersects the die surface. One or more metal layers may be used for this purpose, connected to one or another of the leads of the detector. This arrangement terminates the perpendicular electric field lines on the metal rather than on the semiconductor and fixes the electric potential above the surface junction perimeter at the metal potential independent of whether ions from the die coat accumulating on the surface. This makes the detector less sensitive to stand-off voltage induced ion migration effects. The large area metallization also precludes any lateral surface electric fields over the metal covered regions which might prompt lateral migration of die coat mobile ions across the die surface.

A disadvantage of having the metallization overlap virtually the entire PN junction perimeter is that less light reaches the light sensitive regions of the detector. This reduces the opto-isolator sensitivity. In order to achieve the same detector output impedance, the input LED must be driven harder.

For example, consider an opto-isolator having an output detector without significant overlapping metal that has an electrical output impedance of about $10^6$ ohms in the "off-state", e.g, no LED drive, and an output impedance of about $10^0$ ohms in the "on-state" at, say, 10 milliamps LED drive. If, in order to obtain high stand-off voltage stability, the metallization area of the detector is increased to cover more of the PN junction perimeter and cuts the optically active area of the detector by half, then the input LED drive must be increased to about 20 milliamperes to obtain the same $10^0$ ohms "on-state" impedance.

Unfortunately, the operating life of LEDs decreases with increasing drive. Thus, use of larger area overlapping metal to avoid stand-off voltage instability arising from die coat ion migration, not only degrades the overall opto-isolator sensitivity and transfer characteristic, but also leads to shorter emitter life for a given detector output impedance. In general, semiconductor opto-isolators are not repairable. Hence, degradation or failure of the emitter usually means that the opto-isolator must be discarded.

A further disadvantage of the overlapping metal arrangement is that it is only practical with simple devices or circuits. As the detector complexity increases, i.e., beyond about twenty semiconductor devices, it is more and more difficult to provide the proper junction perimeter overlap with a single metal layer. Multiple layers of metal are sometimes used but these increase the fabrication complexity and cost. For some complex integrated detector circuits, even multiple layers of metal may be impractical. Accordingly, there is an ongoing need for improved opto-isolators which avoid these and other problems.

SUMMARY OF THE INVENTION

It is an object of the present invention to provide improved opto-isolators, especially opto-isolators which support a large stand-off voltage and operate over a wide range of temperature without significant drift or instability induced by the large stand-off voltage and/or elevated temperature, and which are practical and economical to manufacture even when the detector comprises a relatively complex, multi-element semiconductor integrated circuit structure.

The foregoing and other objects and advantages are provided by an electronic device suitable for use as an opto-isolator with an electrically isolated input and output, and comprising an optical emitter coupled to the input and an optical detector coupled to the output and arranged so as to receive light from the optical emitter, wherein the detector has a light sensing region responsive to light originating from the light emitter and various P and N doped regions forming therebetween one or more PN junctions, wherein the PN junctions have a perimeter intersecting the detector surface, and wherein metal regions are provided above the surface for contacting and interconnecting the various P and N doped regions, and wherein the metal regions cover only a small percentage of the PN junction perimeter, and further comprising an amorphous silicon layer located over the light sensing region and over the PN junction perimeter not covered by the metal regions. It is desirable that the amorphous silicon be in electrical contact with the metal regions. The PN junction perimeter covered by the metallization is generally less than about fifty percent, preferably less than about thirty-three and typically less than about fifteen percent of the total junction perimeter.

In a preferred embodiment, the amorphous silicon layer desirably has a resistivity in the range of $10^{12}$ ohms/square and a thickness desirably in the range of about 0.5 micrometers. A dielectric layer is desirably provided between the detector surface and the amorphous silicon layer. An organic die coat or other dielectric optical medium, transparent to the light emitted by the optical emitter, extends between the optical emitter and the detector surface. An opaque outer encapsulation conveniently surrounds the emitter, detector and die coat.

The light sensing element may be a complex electronic function such as for example, an optically activated Schmitt trigger or other latch or logic function or an analog circuit such as a regulator or amplifier or interface device. Photo-diodes and lateral transistors without a base lead are convenient optical sensing elements for use in such complex functions.

The above-described and other embodiments of the light detector are formed by a method comprising, providing a semiconductor substrate having a first region of a first conductivity type extending to a principal surface, forming in the substrate spaced-apart second and third regions of a second, opposite conductivity type thereby creating first and second PN junctions between the first region and, respectively, the second and third regions, wherein the first and second PN junctions are separated by a portion of the first region and intersect the surface and form first and second PN junction perimeters at the surface, and before or after the forming step providing a dielectric layer extending over one or more of the PN junction perimeters and providing a metal layer in contact with at least one of the second or third regions and overlying only a minor percentage (e.g., in the amounts noted above) of the first or second PN junction perimeter, and providing a layer of amorphous silicon contacting the metal layer and lying above the PN junction perimeter exposed from the metal layer. The metal layer and amorphous silicon may be provided in either order.

In a further embodiment, a method for forming a light detecting element comprises, providing a semiconductor substrate having therein one or more P and N doped regions with PN junctions therebetween, wherein the PN junctions have a perimeter which intersects a surface of the substrate and underlies a dielectric layer, then in either order, (i) providing a metal layer contacting at least one of the P or N doped regions and extending over only a small portion of the junction perimeter, and (ii) covering the exposed perimeter with an amorphous silicon layer, wherein the amorphous silicon layer and the metal layer are in electrical contact. Step (i) may be performed before or after step (ii), but it is preferable to perform step (i) first. The percentages of PN junction perimeter coverage noted above are suitable.

The foregoing and other embodiments of the opto-isolator of the present invention are conveniently fabricated by a method comprising, providing a light emitting element, providing a light detecting element as described above, and then mounting the light emitting and light detecting elements in either order on spaced-apart portions of electrical leads and encapsulating the light emitting and light detecting elements in a plastic media wherein a portion of the media between the light emitting and light detecting elements is transparent to light of the emitting element and a surrounding portion of the encapsulation is opaque. It is desirable that the second providing step includes providing a detector comprising a photo-diode or a lateral transistor having a portion of its base region exposed to light from the light emitting element and covered by the amorphous silicon layer.

The present invention provides an improved opto-isolator comprising an electrically separated light emitter and detector. The invented opto-isolator is substantially stable in the presence of high stand-off voltages (e.g., $\geq 10^3$ volts) and over a wide range of temperature (e.g., $-50°$ to $+125°$ C.), even under circumstances where the light sensor is positive with respect to the light emitter, and where the transparent medium extending between the light emitter and sensor contains some mobile ions. The present invention permits complex integrated circuit opto-isolator sensor functions (e.g., an optically activated latch or logic or analog function) to be designed without regard to having nearly all the sensitive PN junction perimeter and nearby regions covered by protective metal as a shield against such mobile ions, as in the prior art. This is a great design and manufacturing convenience.

The improved capability of the present invention arises from the combination of features of the invented structure including, but not limited to, having only a small portion of the junction perimeter at the surface underlying the metallization and having substantially the remaining junction perimeter and the optically sensitive regions of the detector or an optically actuated integrated circuit covered by an amorphous silicon layer in electrical contact with the metallization.

BRIEF DESCRIPTION OF THE FIGURES

FIG. 2 is a simplified composite plan view of one-half of an optically fired TRIAC according to the prior art and FIGS. 3-7 are similar plan views of the various masks or regions which make up the composite plan view of FIG. 2;

DETAILED DESCRIPTION

Figure 1:
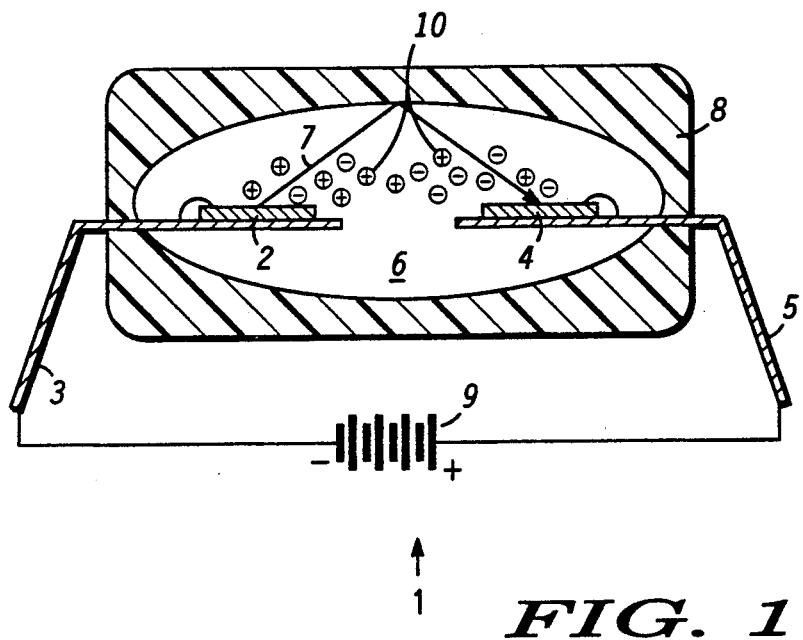
FIG. 1 is a simplified cross-sectional view through an opto-isolator showing the occurrence of stand-off voltage induced ion migration between emitter and detector.
Figure 8:
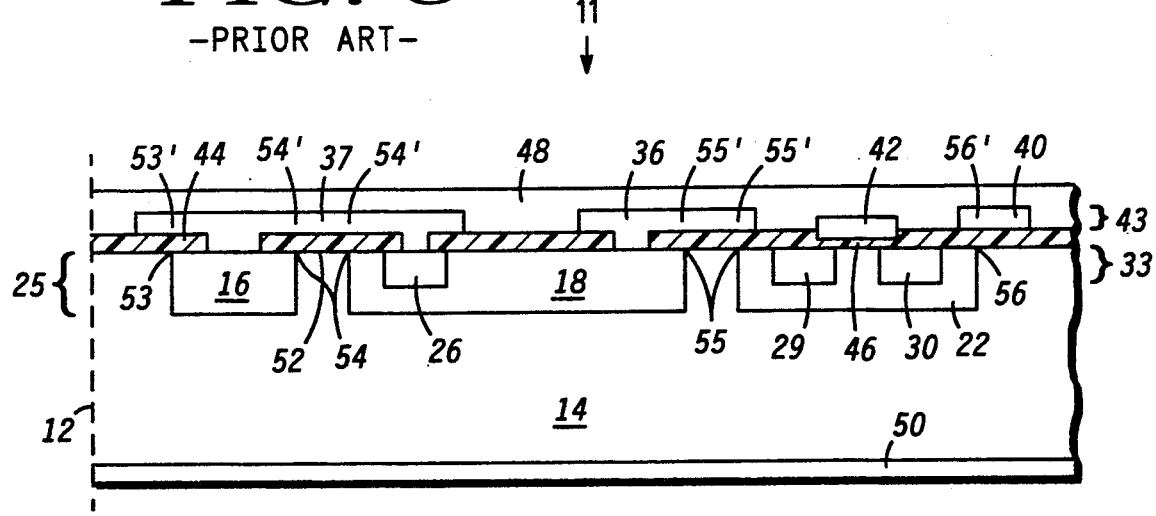
FIG. 8 is a simplified cross-sectional view through one-half of the optically fired TRIAC of FIG. 2 at the indicated location.
Figure 2:
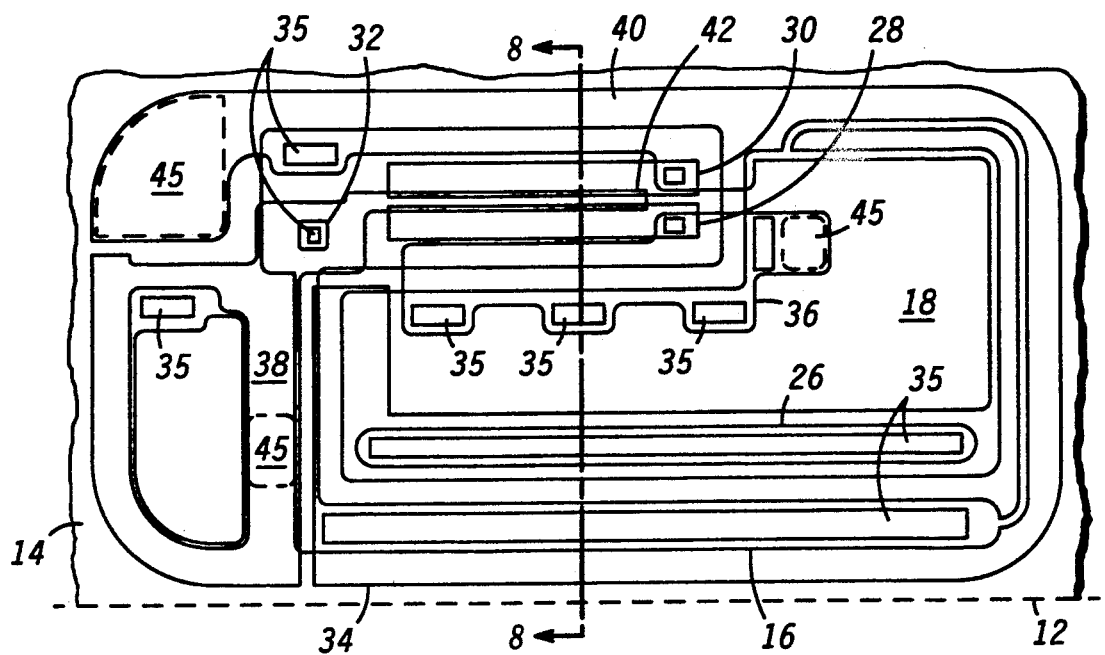

FIG. 2 is a composite top view in simplified form of the principal mask layers or die regions used to form one half of opto-isolator 11 according to the prior art, illustrating a number of construction features common in the prior art. FIGS. 3-7 show the individual layers of die regions resulting therefrom which make up the composite of FIG. 2. FIG. 8 is a cross-section through the structure of FIGS. 2-7 at the indicated location. Opto-isolator 11 is formed from two identical die regions corresponding to FIGS. 2-8 which are symmetric about mirror-line 12. Accordingly, only one half of the mirror symmetric structure will be described.

Those of skill in the art will understand that FIGS. 2-7 may be considered to represent either the mask layers or the resulting regions formed in or on the semiconductor die or both. For the purpose of this application, the mask layers and corresponding die regions are treated as being equivalent. The individual process steps used to form the various P, N, dielectric and metal regions of the detector corresponding to the mask layers, are well known in the art and will not be described in detail here.

In the particular example illustrated in FIGS. 2-8, substrate 14 is typically N-type silicon although other semiconductor materials may also be used. While the exemplary device uses an N-type substrate with various P and N regions formed therein, the opposite conductivity types could also be used.

Figure 3:
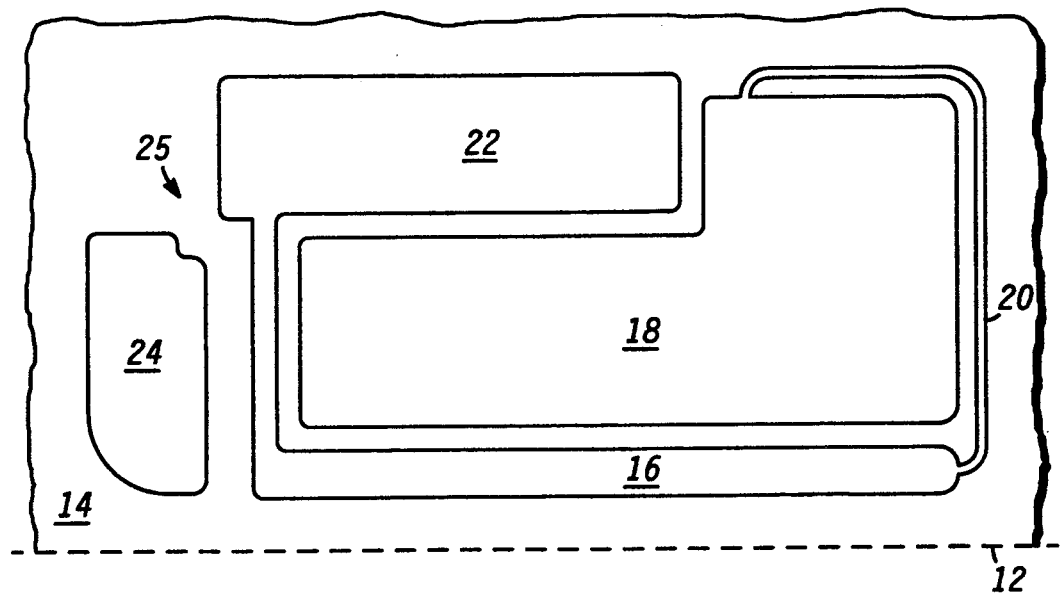
Figure 4:
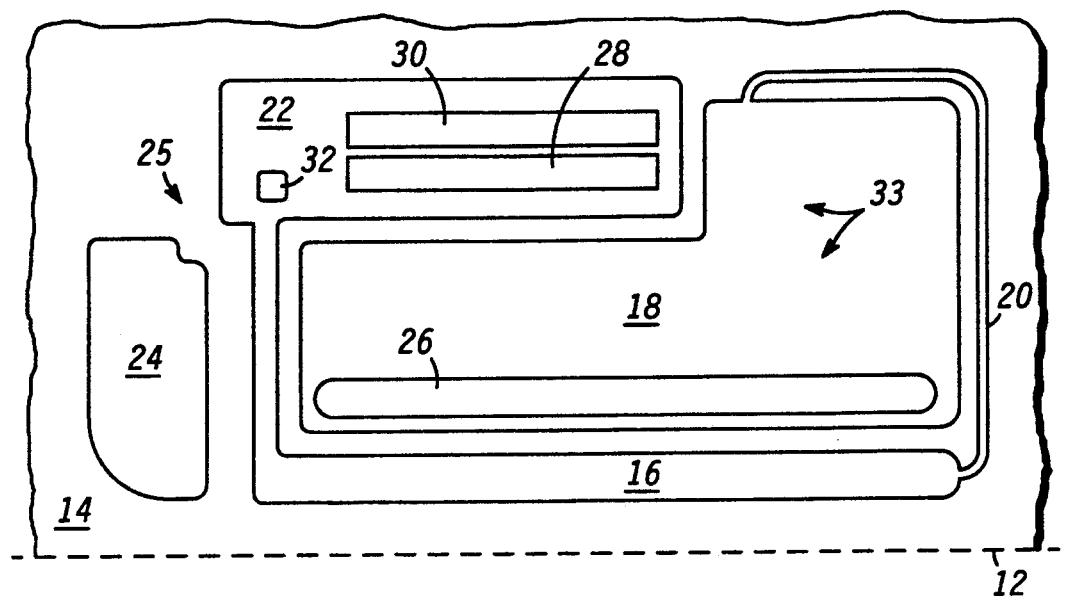
Figure 5:
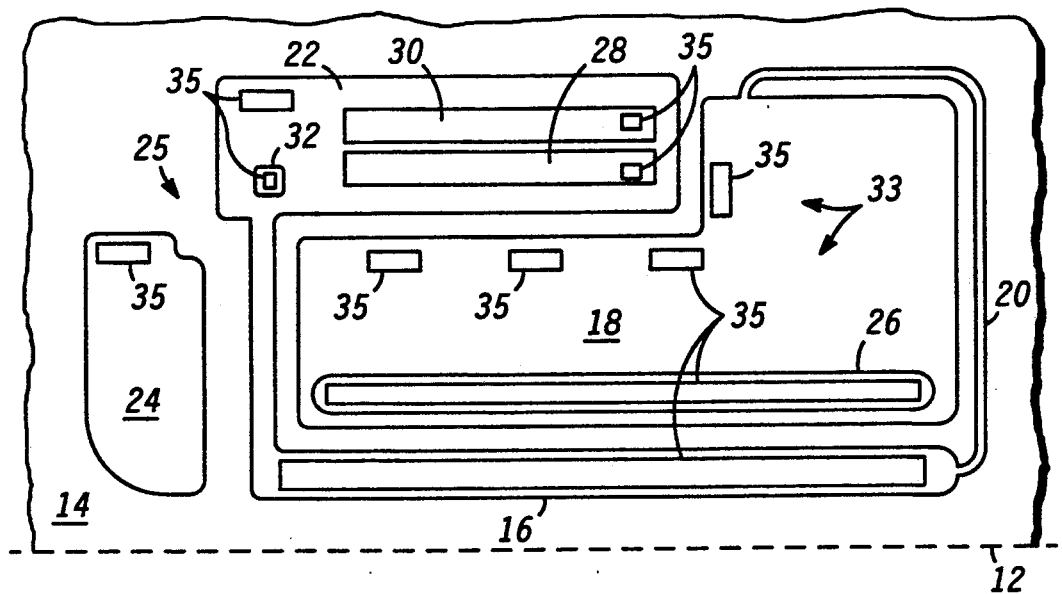

FIG. 3 shows P regions 16, 18, 20, 22 and 24 (collectively 25) formed in N-type substrate 14 using means well known in the art. FIG. 4 shows the pattern of N+ regions 26, 28, 30, 32 (collectively 33) which are formed within P regions 25 of FIG. 3. FIG. 5 shows various contact openings (collectively 35) provided to the P and N+ regions of FIGS. 3-4 and FIG. 6 shows the metallization regions 34, 36, 38, 40, 42 (collectively 43) that are provided to interconnect the various N+ and P regions and provide a MOSFET gate to form an optically driven high voltage TRIAC. FIG. 7 shows openings 45 in amorphous silicon layer 48 (see FIG. 8) provided for making electrical contact to metal 43. The combination of FIGS. 3-7 is shown in FIG. 2.

FIG. 8 is a cross-section at the indicated location through part of the TRIAC of FIG. 2. Only one half of the whole TRIAC structure is shown in FIG. 8, since the other half is mirror symmetric about line 12. As can be seen in FIG. 8, TRIAC 11 also comprises dielectric layer 44, 46 between metallization 43 and substrate 14 and amorphous silicon layer 48 overlying metallization 43. Substrate 14 has back-side contact 50.

A particular feature of the prior art high voltage TRIAC of FIGS. 2-8 is that metallization 43 overlaps virtually all (i.e., about ninety-five percent) of PN junction perimeter 53-56 where the PN junction formed between P region 25 and N region 14 intersects die surface 52. Overlap of junction perimeter 53-56 by regions 53'-56' of metallization 43 is readily seen in FIG. 8. The PN junction between regions 25 and 14 is the principal blocking junction of TRIAC 11 and it is across this junction that the high blocking voltage (e.g., ~800 volts) supported by the TRIAC itself appears. Perimeter 53-56 of this junction at surface 52 junction is sensitive to the presence of mobile ions from die coat 6 (or encapsulation 8), and without this metal overlap significant stand-off voltage instability is observed. Metal overlap 53'-56' over blocking junction perimeter 53-56 substantially eliminates the effect of die coat ion migration produced by stand-off voltage 9 and/or elevated temperatures because overlap region 53'-56' of metallization 43 electrostatically shields junction perimeter 53-56 from any surface charge on or above metallization 43.

The prior art TRIAC of FIGS. 2-8 has amorphous silicon layer 48 overlying metallization 43. Openings 45 are provided in amorphous silicon layer 48 to facilitate contact to underlying metallization 43. The anode (or cathode) contact to one half of TRIAC 11 is via large opening 45 on metal region 40 (see FIG. 2) and the cathode (or anode) contact is to the corresponding region on the other half of the TRIAC (not shown) across mirror line 12. As the TRIAC operates across an AC line, the two contacts alternate as anode and cathode.

The purpose of amorphous silicon layer 48 is to control the potential gradient in the plane of the detector surface in order to deal with device problems that may arise within the detector due to the lateral electric field produced by the internal detector blocking voltage, i.e., the anode-cathode voltage drop across the TRIAC. Even though amorphous silicon 48 has a very high resistivity, it is more conductive than underlying dielectric 44, 46, of e.g., $SiO_2$, and therefore provides a substantially uniform potential gradient along the surface of the TRIAC between metal region 43 which is at the TRIAC anode (or cathode) potential and the corresponding metal region (not shown) across mirror line 12 which is at the TRIAC cathode (or anode) potential, and between metal region 43 and a metal guard ring (not shown) which surrounds the TRIAC near the scribe grid of the chip.

The principal power carrying leads of the TRIAC attach to region 40 of metal layer 43 through opening 45 thereon. Control of the lateral surface potential gradient, i.e., the lateral electric field, is important to prevent degradation of the blocking voltage capability of the TRIAC itself. This is generally independent of concern about the stand-off voltage capability of the opto-isolator which is determined primarily by the emitter-detector arrangement and spacing and the dielectric quality of the intervening die coat (or other dielectric) and surrounding encapsulation which, along with the stand-off voltage, determine the stand-off electric field approximately perpendicular to the surface.

While overlapping most of the junctions with metal has been useful for making fairly simple opto-isolators resistant to stand-off voltage induced instabilities, and amorphous silicon has been useful for obtaining uniform lateral surface potential gradients in high voltage TRIACS and the like, it has not been known in the prior art how to avoid stand-off voltage induced instabilities in relatively lower operating voltage devices or circuits where overlapping most of the junctions or other sensitive detector regions with metal is not practicable and where, historically, providing an amorphous silicon layer for lateral potential gradient control has not been desired or needed.

This and other problems having to do with opto-isolator design flexibility and manufacturing convenience are solved by the present invention wherein PN junctions and other sensitive detector regions are left uncovered by metal, that is, generally more than about half of the junction perimeter where it intersects the detector surface, conveniently more than about two-thirds of the junction perimeter and preferably more than about eighty-five percent of the junction perimeter is left uncovered by metal, and such uncovered portions of the junction perimeter and the other sensitive device regions are covered by a layer of amorphous silicon in electrical contact with the metal.

It has been found that detectors constructed in the above-described fashion exhibit much improved stand-off voltage stability viz-a-viz detectors not having the amorphous silicon layer. Being able to have the PN junction perimeter substantially free of metal makes it possible to design much more complex detector circuits, as for example monolithic integrated detector circuits providing latch or logic or complex analog functions and having more than about twenty semiconductor elements. This would not be practical were it necessary to continue to overlap substantially all of the junction perimeter with metal, as in the prior art. Thus, the invented arrangement and method provide valuable improvements and advantages much desired in the art.

A preferred embodiment of the invention is illustrated in FIGS. 9-15 which are views of a generally similar nature as those of FIGS. 2-7, in that, like FIGS. 2-7, they show simplified plan drawings of the various regions or masks used to make a semiconductor device or circuit, but according to the present invention and of substantially greater complexity than the semiconductor device of FIGS. 2-7. FIG. 16 is a simplified representational cross-section intended to show the vertical profile of various types of semiconductor elements contained within the integrated circuit of FIG. 9. It is not intended to be a view at a particular cut line.

The preferred embodiment of the present invention is described for convenience of explanation in terms of an exemplary optically sensitive integrated circuit (a Schmitt trigger) using a particular semiconductor substrate (silicon) of a particular conductivity type (P-type) and with various N and P regions provided therein. Those of skill in the art will understand based on the description herein that other semiconductor materials and conductivity types could be used and other optically electrical circuits implemented in integrated form using the present invention, and that the particular example provided is for simplicity of explanation and not intended to be limiting.

Figure 9:
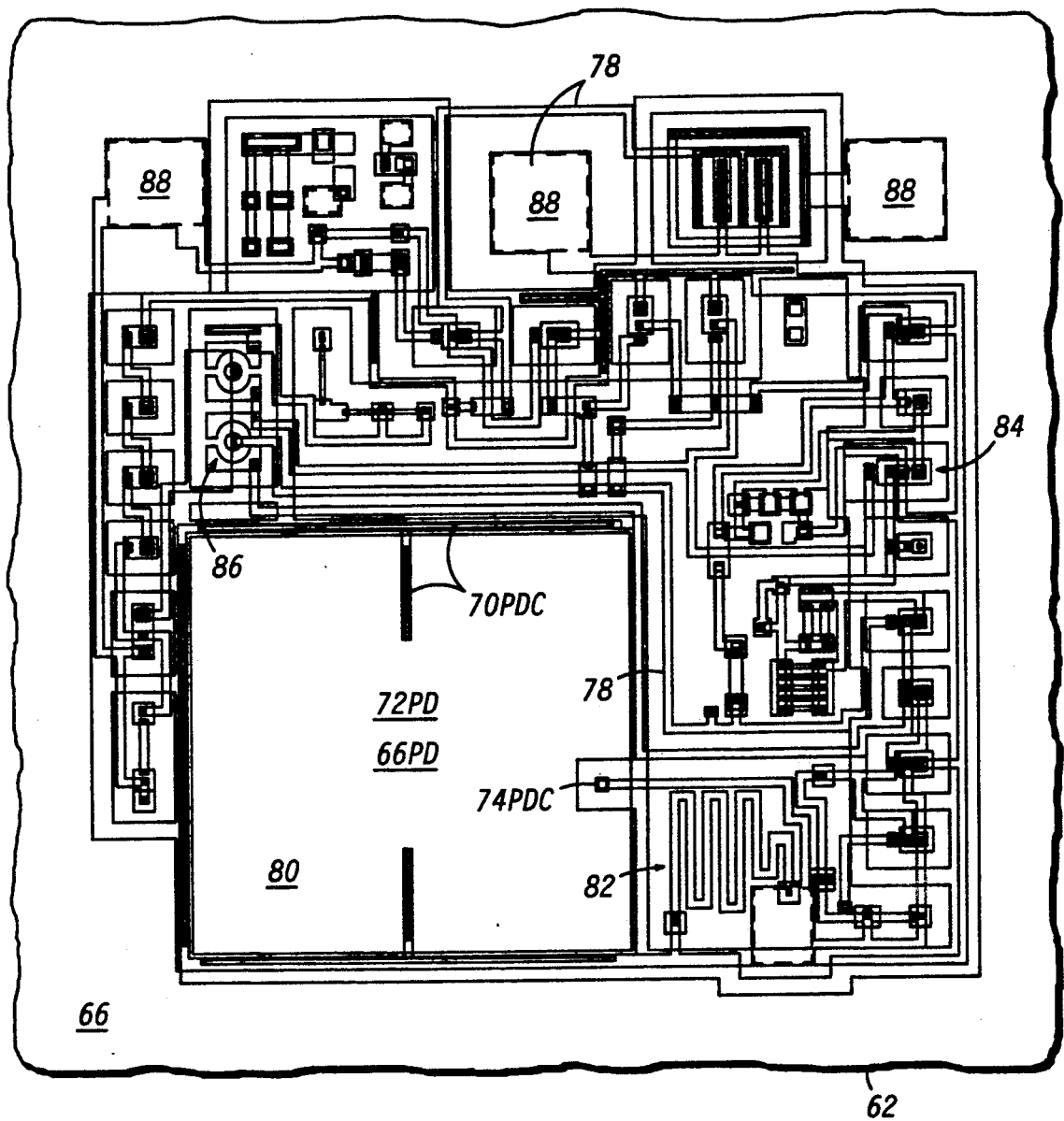
FIG. 9 is a simplified composite plan view of an optically fired integrated detector circuit according to the present invention and FIGS. 10-15 are similar plan views of the various masks or regions which make up the composite plan view of FIG. 9.

FIG. 9 is a simplified plan view, in composite form, of optically activated Schmitt trigger detector 60, according to the present invention, suitable for use in an opto-isolator. FIGS. 10-15 are simplified plan views of the different regions or combinations of regions making up the composite of FIG. 9, at different stages of fabrication. The details of the individual process steps required to fabricate detector 60 will not be described as they are conventional and well known in the art.

Figure 10:
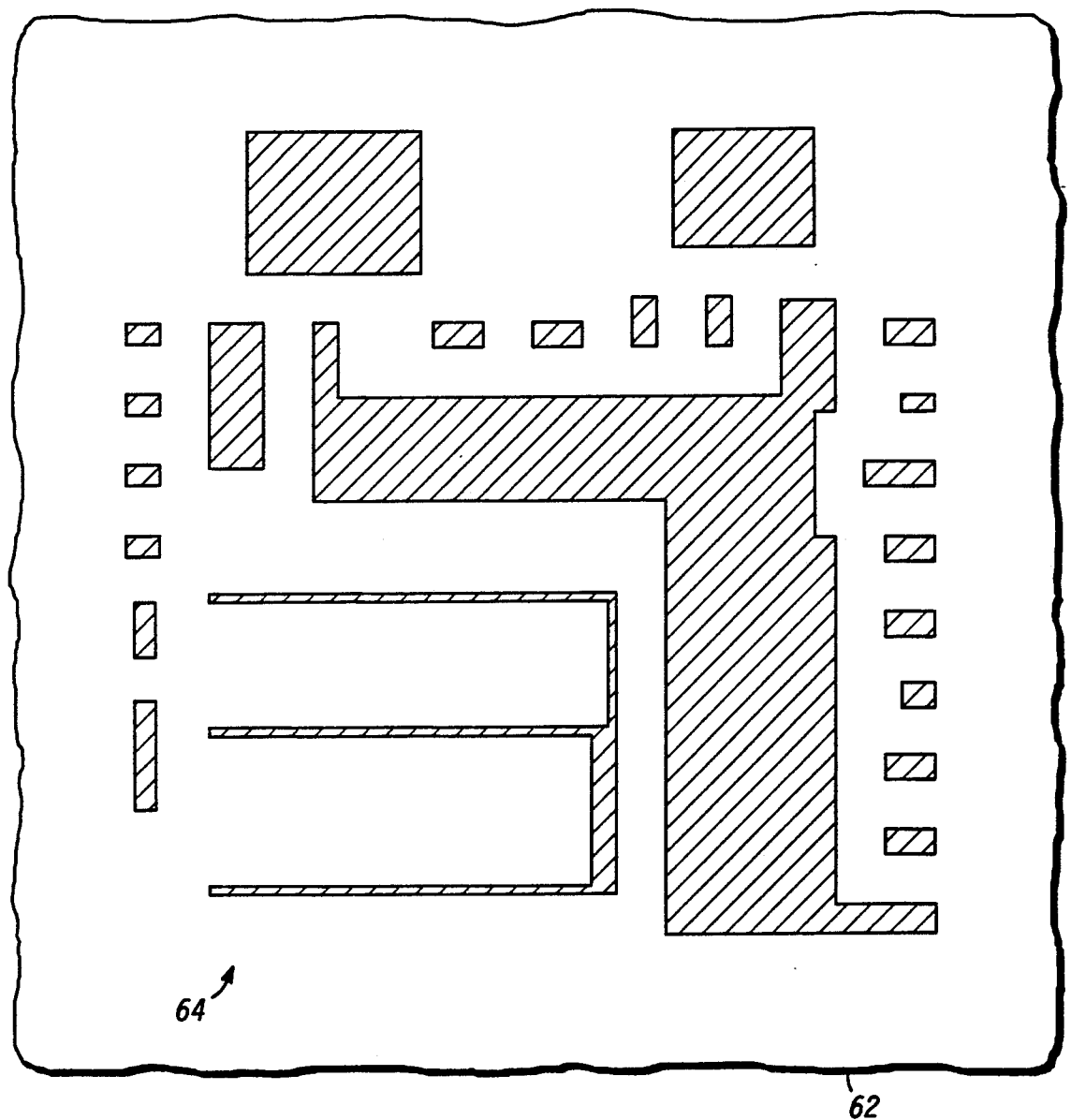

In the preferred embodiment, Schmitt trigger optical detector 60 is conveniently fabricated on P-type silicon substrate 62 in which is provided, using means well known in the art, N+ buried layer 64 (see FIG. 10). The purpose of buried layer 64 is to reduce the series resistance associated with collector regions of NPN transistors. In order to avoid having subsequent and composite figures become so crowded as to preclude understanding of the various regions therein, buried layer 64 is omitted in FIGS. 9 and 11-15. Those of skill in the art will understand based on the description herein, its function and relationship to the other regions of detector 60.

Figure 11:
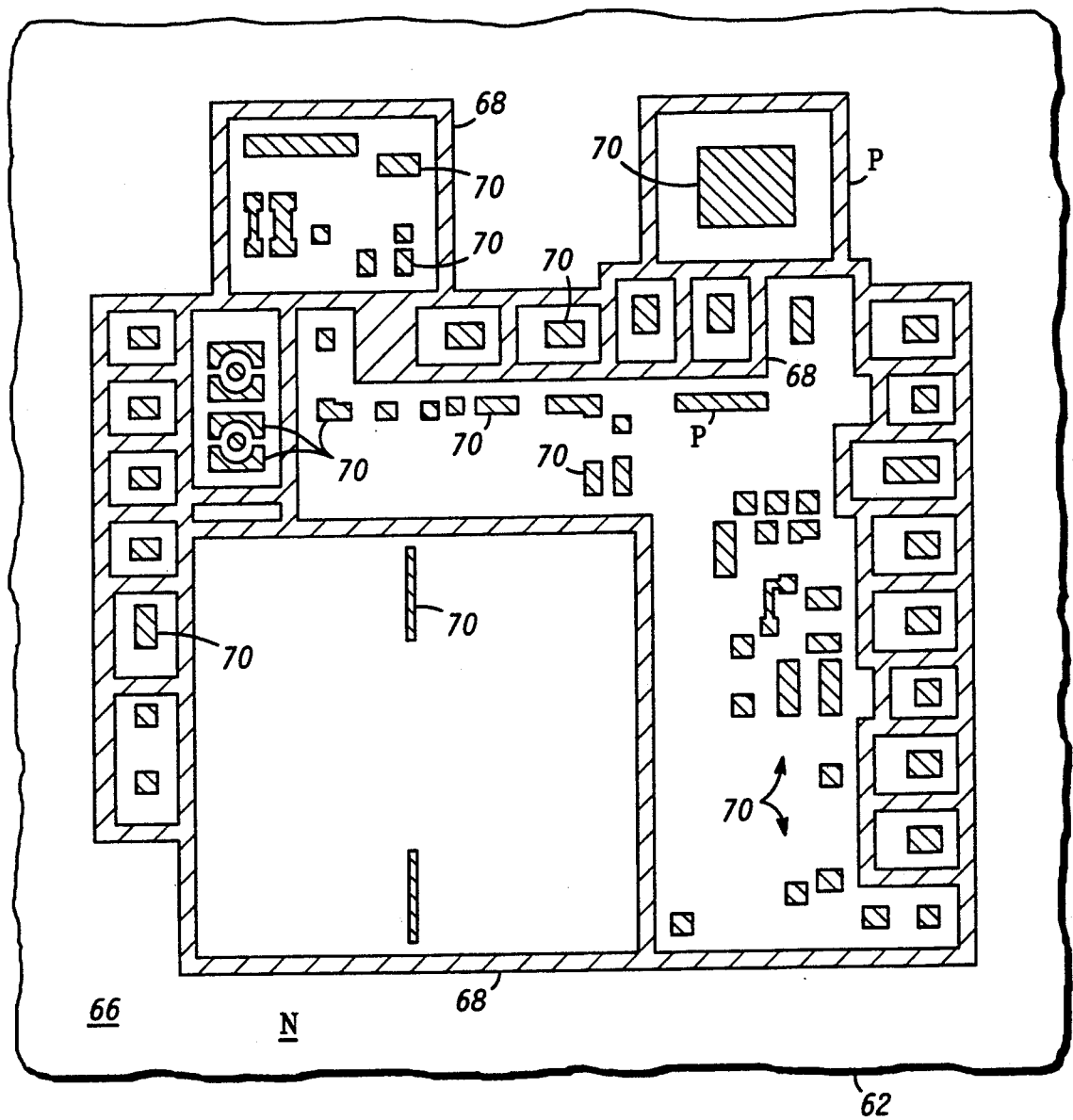

By way of example, N-type layer 66 of approximately twelve micrometers thickness is formed over substrate 62 and buried layer 64 using means well known in the art. Referring now to FIG. 11, P-type isolation walls 68 are then formed in N-type layer 66 extending through layer 66 to P-type substrate 62. P-type base regions 70 about five micrometers deep are also typically provided in N-type layer 66. In FIG. 11, isolation walls 68 are identified by hatching with a slope of +45° and base regions 70 by hatching with a slope of −45°. In subsequent figures the hatching of regions 68, 70 is omitted for clarity.

Figure 12:
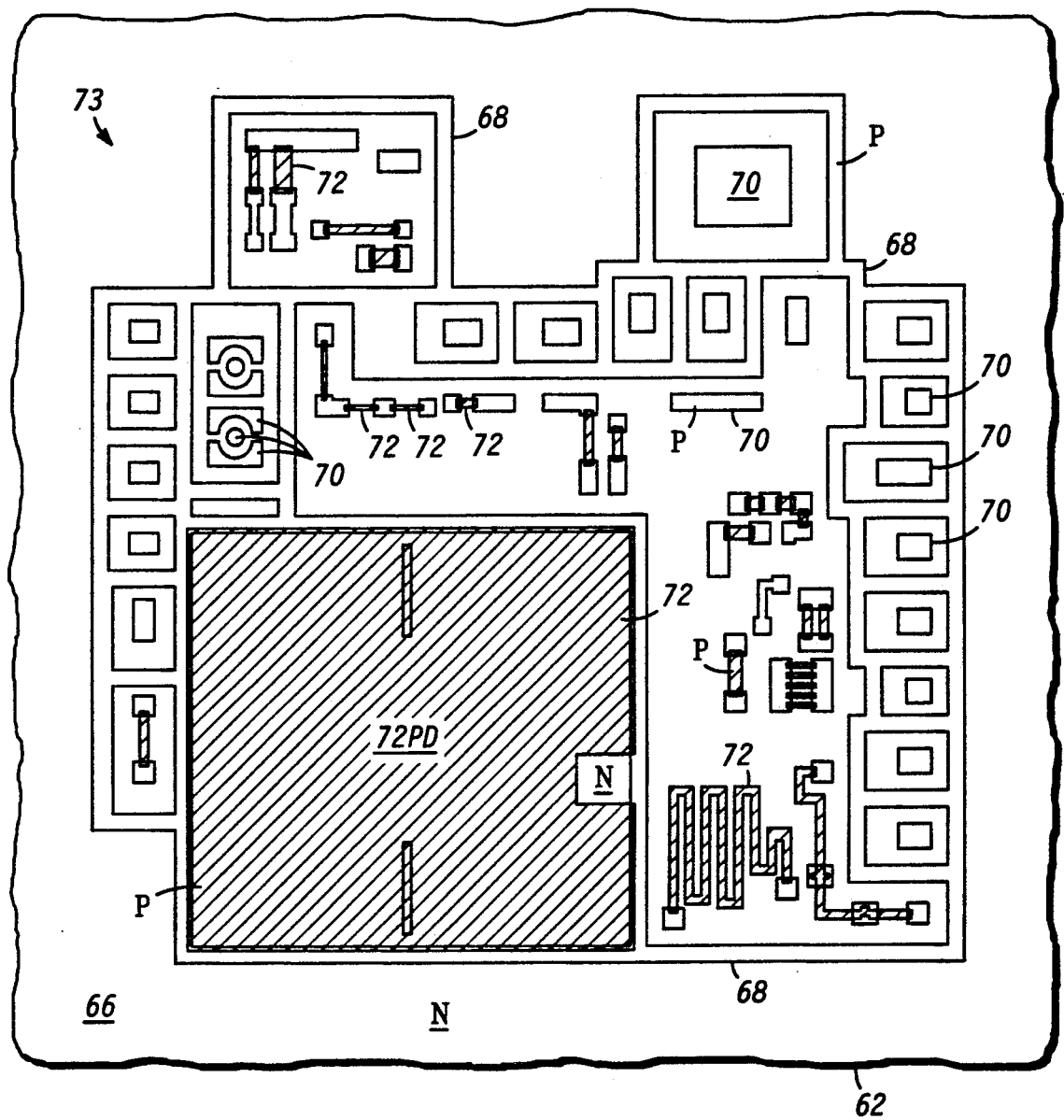

Referring now to FIG. 12, P-type resistor and photodiode regions 72 of about the same depth as base regions 70 are formed in epi-layer 66 and are shown hatched and superimposed on P-type isolation walls 68 and P-type base regions 70. The hatching used in FIG. 12 to facilitate identification of P-type resistor and diode regions 72 is omitted in subsequent views and the composite of FIG. 9.

FIG. 12 shows the combination of all of P regions 68, 70, 72. The spaces between P regions 68, 70, 72 are as-yet undisturbed N regions of epitaxial layer 66. The PN junction formed between P regions 68, 70, 72 and N region 66 is the principal blocking junction of IC 60. This PN junction extends to semiconductor surface 87 (see FIG. 16) and has perimeter 73 therein, i.e., where the PN junction formed between P regions 68, 70, 72 and N region 66 intersects semiconductor surface 87.

Figure 13:
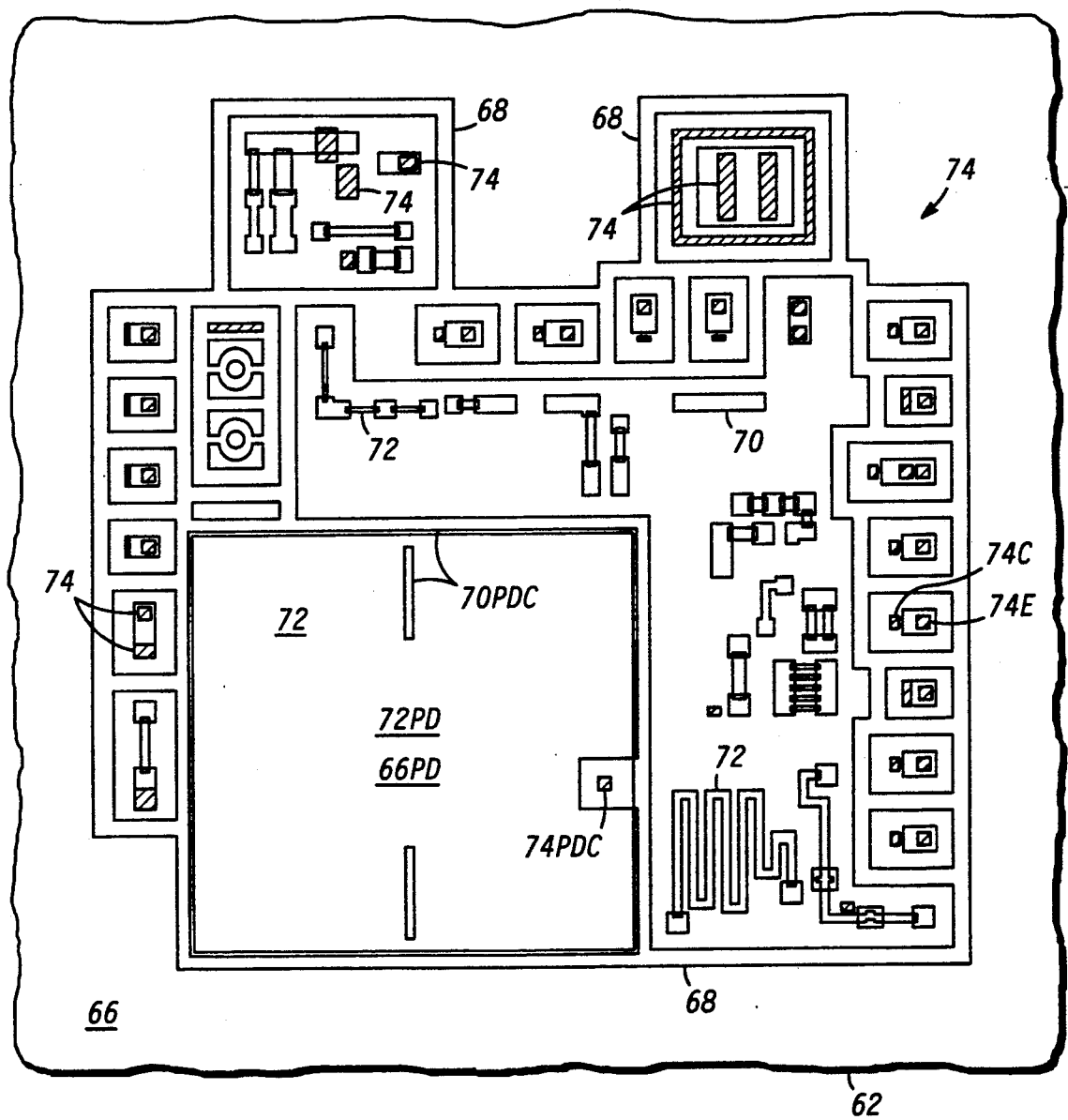

Referring now to FIG. 13, N+ emitter and collector contact regions 74 of, for example, approximately three micrometer depth are provided in P region 70, 72 and-/or epi-region 66 as indicated by the additional regions 74 shown in FIG. 13. Exemplary emitter regions 74E and collector contact regions 74C are identified. Again, hatching is used to facilitate identification of N+ regions 74 in FIG. 13 and omitted in subsequent views and the composite view of FIG. 9. Those of skill in the art will have no difficultly understanding the purpose of the various N+ regions shown, even without a detailed description of their function. For example, P region 70PDC and N region 74PDC serve as the contacts to the comparatively large photodiode formed between P region region 72PD and the N region formed by the underlying portion 66PD of epi-layer 66.

The above-described P and N regions may be formed by any convenient doping means with implantation being preferred for the base and resistor/photo-diode regions and conventional deposition and high temperature drive-in for the other regions. However, any convenient means having sufficient control may be utilized. Such doping steps are well known in the art.

Figure 14:
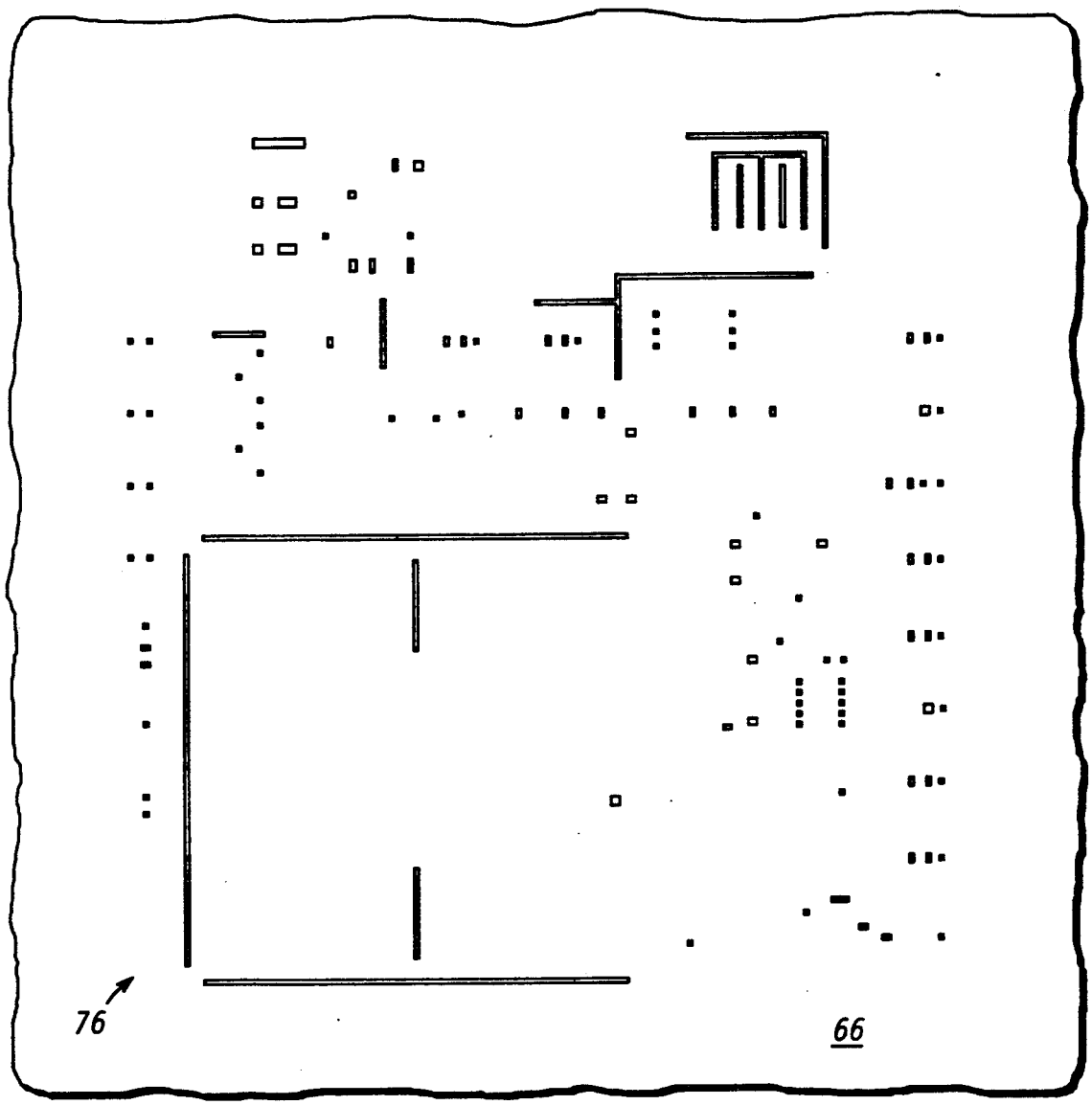
Figure 15:
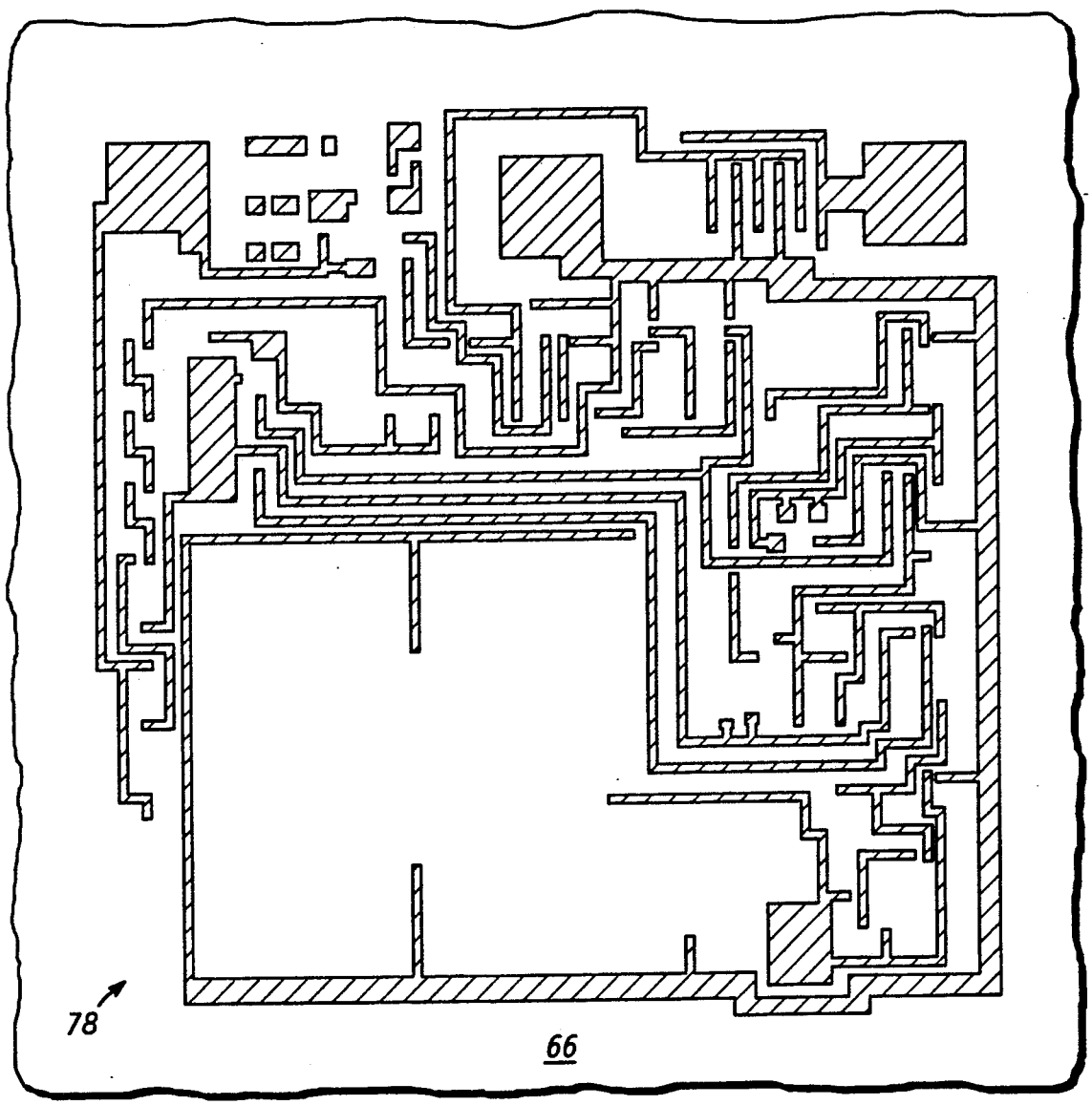
Figure 16:
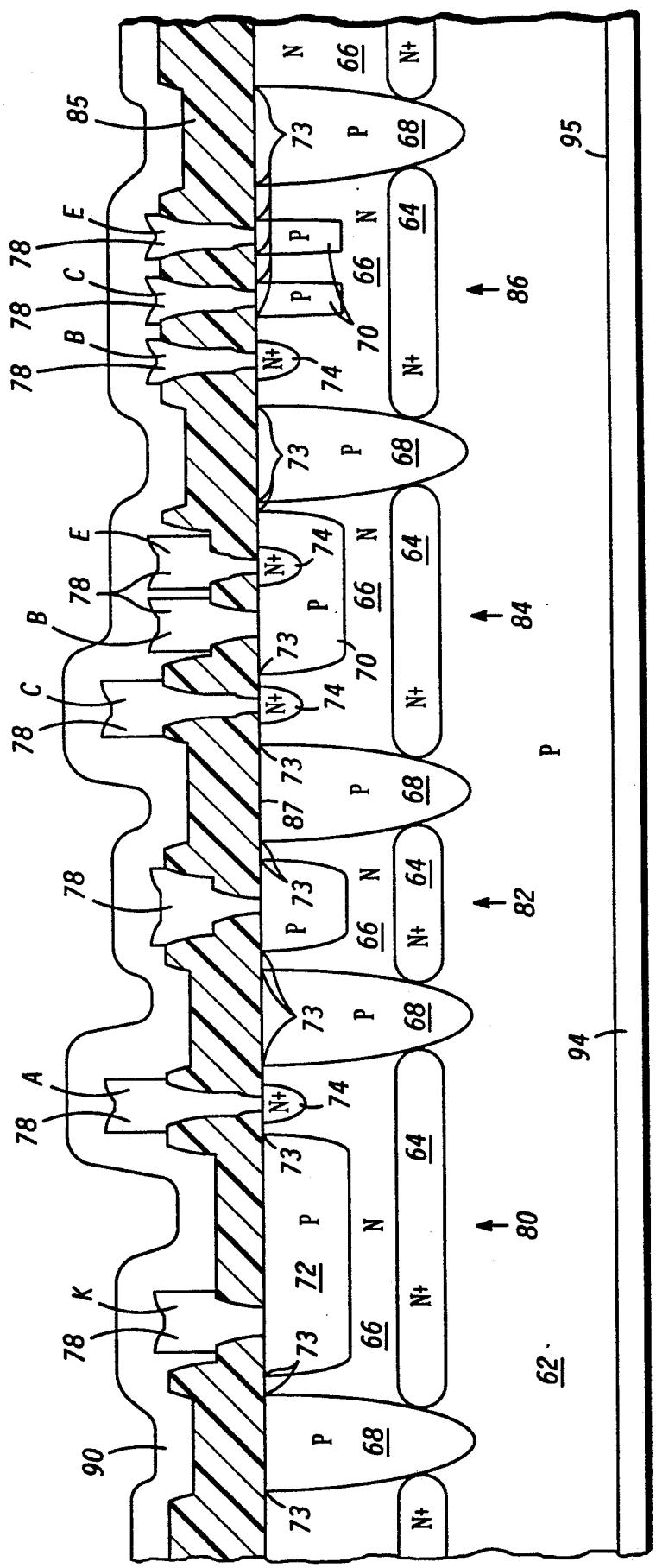
FIG. 16 is a simplified representational cross-sectional view through a portion of the detector circuit of FIG. 9 to illustrate the vertical profile of different device types employed in the integrated circuit of FIG. 9.

FIG. 14 shows the contact mask or contact regions 76 and FIG. 15 shows the metallization mask or metallization regions 78 used to interconnect the various N and P regions to form the intended optically activated Schmitt trigger, integrated circuit detector. The composite of all of the layers or regions of FIG. 11-15 is shown in FIG. 9. (The buried layer in FIG. 10 is omitted to reduce line crowding in the composite of FIG. 9).

It will be readily apparent that metallization 78 covers only a small fraction, estimated to be less than about fifteen percent, of PN junction perimeter 73 at surface 87. This is to be contrasted with the arrangement of FIG. 2, where virtually all of PN junction perimeter 53-56 at the device surface was covered by metallization. With the present invention, the PN junction perimeter covered by the metallization is generally less than about fifty percent, preferably less than about thirty-three and typically less than about fifteen percent of the total PN junction perimeter between the P (e.g., isolation, base, resistor, diode) region and the N-epi (e.g., collector, lateral base region).

FIG. 16 is a representational cross-sectional view of the semiconductor integrated circuit of FIG. 9 illustrating the vertical profile of various of the device types employed in the integrated circuit of FIG. 9. FIG. 16 is not intended to be a literal cross-section through any particular region of the circuit of FIG. 9, but rather to show the vertical profile of various types of devices of the integrated circuit of FIG. 9 which may be found at different locations in FIG. 9.

Regions 80, 82, 84, and 86 in FIG. 16 illustrate the vertical profile of various typical device regions. For example, region 80 is a PN photo-diode, region 82 a diffused or implanted resistor, region 84 a vertical NPN transistor and region 86 a lateral PNP transistor. Corresponding examples of these device types are indicated by the same reference numerals on FIG. 9. Dielectric 85, of for example silicon dioxide, is provided between semiconductor surface 87 and metallization 78 in the conventional manner and contact openings 76 are provided therein to permit metallization 78 to makes contact, as shown in FIGS. 9-16, with the various P and N regions of the detector 60. Conventional openings 88 (see FIG. 9) are provided in any overlying passivation to facilitate bonding of external leads to metallization layer 78. Back metal 94 is conveniently provided on rear face 95 of substrate 62.

It was found that when optically triggered circuit 60 shown in FIGS. 9-16 was fabricated in a conventional fashion for typical bipolar integrated circuits with, for example, regular oxide passivation which is known to provide stable devices in ordinary IC applications, and used as detector chip 4 in opto-isolator 1, it suffered from substantial instability even when exposed to modest stand-off voltages (e.g., $\geq 100$ volts) and especially when exposed to large stand-off voltages (e.g., $\geq 1000$ volts). The instability was exacerbated by elevated temperatures (e.g., $\geq 100°$ C.). This was true even though detector 60 itself operated at low voltages, as for example 5 to 15 volts. The instability was most severe when stand-off voltage 9 was such that detector 4, 60 was positive. The instability effect is accelerated by increasing the stand-off voltage and/or increasing the operating temperature. At 1000 volts stand-off voltage (detector chip 4 positive) and an operating temperature of 100° C., detector 60 failed by latching on in the absence of optical input (LED current=0) within five minutes. If the stand-off voltage was reversed, or if the stand-off voltage was removed and the part left hot for a few minutes to a few hours, the detector chip would recover to its initial state, apparently without permanent damage.

It was found that this stand-off voltage instability could be substantially eliminated by providing substantially undoped amorphous silicon layer 90 over (or under) metallization 78 (see FIG. 16) and in electrical contact therewith. This improvement in stability is obtained even though (i) metallization 78 is unchanged and does not significantly overlap PN junction perimeter 73 of detector 60, and (ii) detector 60 operates at low voltage and amorphous silicon is not needed to provide uniform lateral voltage drops across detector 60. This is in contrast with the prior art where junction overlap metallization has historically been used for avoiding such stand-off voltage instability. In the preferred embodiment, amorphous silicon layer 90 is located over metallization 78.

It was not previously known that amorphous silicon alone would prevent voltage stand-off instability in detectors employed in opto-isolators or other devices which are subjected to significant stand-off voltages, particularly where the detector is positive, since amorphous silicon has always been used in combination with arrangements employing almost complete junction perimeter overlap metallization.

Amorphous silicon layer 90 is conveniently formed by vacuum evaporation or sputtering or chemical vapor deposition using means well known in the art, with vacuum evaporation being preferred. A vacuum evaporator manufactured by International vacuum Company, Inc., of Pembroke, Mass., was used with good results.

The layers were deposited at a temperature of about 100° C. Thicknesses of about 0.2 to 1.0 micrometers are convenient with about 0.2 to 0.6 micrometers being suitable and about 0.3 to 0.5 micrometers being preferred. It is desirable that amorphous silicon layer 90 have a resistivity in the range of about $10^{10}$ to $10^{13}$ ohms per square with about $10^{11}$ to $8 \times 10^{12}$ ohm per square useful and about $10^{12}$ to $5 \times 10^{12}$ ohms per square being preferred.

Amorphous silicon is typically obtained by deposition at comparatively low temperatures (e.g., $\leq 200°$ C., typically $\leq 100°$ C.) where the energy of the arriving atoms on the surface is sufficiently low so that their mobility on the surface is negligible. Under these circumstances there is insufficient motion of the arriving atoms to permit formation of the crystallites that generally are present in polycrystalline silicon. Thus, amorphous silicon is characterized by having only very short range order, that is, being more glass-like than microcrystalline in structure. Amorphous silicon layers generally have a lower carrier mobility and higher resistivity than polycrystalline silicon layers of comparable doping.

One of the advantages of amorphous silicon for the present application is that the sheet resistance of the amorphous silicon is high enough that the amorphous silicon may be used as a passivation layer over (or under) the metallization without shorting the metal traces to the different device regions together. In other words, so far as the operation of the IC is concerned, the presence of the substantially uniform amorphous silicon overcoating has negligible effect and does not interfere with circuit operation. This is a substantial manufacturing advantage since it is not necessary to provide a dielectric separation between the metal traces of the IC and the amorphous silicon..

Table I below shows the comparative stability behavior of detector 60 when used as detector chip 4 in optoisolator 1 without and with amorphous silicon layer 90, under a stand-off voltage of about 1000 volts, and with detector 4, 60 positive. The first column shows the test temperature. The second column shows that no failures were observed when the same test was performed on the prior art TRIAC of FIGS. 2–8. The third column shows the percentage failures observed with Schmitt trigger IC 60 described in connection with FIGS. 9–16 without any amorphous silicon layer, that is, fabricated in the conventional manner for bipolar IC's using a process which otherwise provides stable devices when not exposed to a large stand-off voltage. The fourth column shows the results for the same chips as in the third column but with amorphous silicon layer 90 provided thereon over metallization 78, as shown in FIG. 16.

TABLE I

PERCENTAGE FAILURES UNDER STAND-OFF VOLTAGE STRESS TEST FOR DIFFERENT TIMES AND TEMPERATURES

| TEST TEMPER- ATURE | PRIOR ART TRIAC | IC 60 WITH- OUT AMOR- PHOUS Si | IC 60 WITH AMORPHOUS Si |
|---|---|---|---|
| 27° C. | 0% (>72 hrs) | 100% (<72 hrs) | 0% (>72 hrs) |
| 100° C. | 0% (>200 hrs) | 100% (<72 hrs) | 0% (>550 hrs) |

It will be apparent from the data of Table I that the detector and opto-isolator according to the present invention is very stable in the presence of large stand-off voltages even at elevated temperatures. It is further apparent that a complex integrated circuit detector, according to the present invention, can be subjected to large stand-off voltages and high temperatures without adverse affect, even though the integrated detector circuit does not have the almost complete junction metallization overlap of the prior art.

It is further apparent that the invented arrangement and method permits much greater flexibility of layout design and/or wafer processing than had hitherto been possible and permits construction of more complex electronic detector functions without need for elaborate metallization, including perhaps multi-layer metallization, which was heretofore required to provide virtually complete PN junction perimeter coverage in complex circuits.

While the present invention has been described in terms of particular embodiments, those of skill in the art will appreciate based on the explanation herein that the invented arrangement applies to other detector function and circuits, as for example but not limited to, other triggers or latches or digital logic or analog functions, and that it is particularly well suited for use in connection with detectors having substantial complexity, that is, more than about twenty semiconductor devices or elements. Further, it will be understood that while the present invention has been described particularly in terms of amorphous silicon layers other semiconductor materials of equivalent properties may also be used.

Those of skill in the art will understand based hereon that many variations may be made in the particular detector circuit used and the arrangement of devices or elements within the particular optically activated integrated circuit layout employed and in the materials, structures and junction depths and extent, and in the individual process steps used, without departing from the spirit and scope of the present invention. Accordingly, it is intended to include such variations in the claims that follow.

We claim:

1. An electronic device having an electrically isolated input and output, and comprising:
   an optical emitter coupled to the input for emitting light in response to an electrical input signal;
   an optical detector coupled to the output and having a light sensitive means for changing the electrical impedance of the detector at the output in response to light from the emitter striking the light sensitive means, wherein the detector has various P and N doped regions forming therebetween one or more PN junctions extending to a surface of the detector and defining a PN junction perimeter at the surface;
   a metal region above the surface for contacting and interconnecting the various P and N doped regions, wherein the metal region covers less than about half of the PN junction perimeter; and
   an amorphous silicon layer at least partially transparent to light from the emitter located at least over the PN junction perimeter not covered by the metal region and over the light sensitive means.

2. The device of claim 1 wherein the amorphous silicon layer has a sheet resistance in the range of $10^{10}$ to $10^{13}$ ohms per square.

3. The device of claim 1 wherein the amorphous silicon has a thickness in the range of about 0.2 to 1.0 micrometers.

4. The device of claim 1 further comprising a dielectric layer between the surface and the amorphous silicon layer.

5. The device of claim 1 wherein the detector comprises a light actuated Schmitt trigger circuit.

6. The device of claim 5 wherein the Schmitt trigger circuit has a transistor having a region sensitive to light and the region sensitive to light comprises a base region of the transistor.

7. An electronic device comprising:
a light emitter for emitting light;
a semiconductor integrated circuit comprising a light detector and having a principal surface, wherein the detector comprises multiple PN junctions extending to the principal surface and forming an intersection therewith, and having metallized regions overlying less than half of the intersection of the multiple PN junctions with the surface, and having a layer of amorphous silicon overlying the surface and in contact with the metallized regions, wherein the amorphous silicon layer is at least partially transparent to light and passes light from the light emitter into the light detector of the semiconductor integrated circuit.

8. The device of claim 7 wherein the semiconductor integrated circuit comprises an optically activated Schmitt trigger.

9. The device of claim 8 wherein the optically activated Schmitt trigger comprises an optically activated lateral transistor as the light detector.

* * * * *